(12) United States Patent
Zhang et al.

(10) Patent No.: US 10,644,676 B2
(45) Date of Patent: May 5, 2020

(54) AUTOMATIC FILTERING METHOD AND DEVICE

(71) Applicant: OMRON CORPORATION, Kyoto-shi, Kyoto (JP)

(72) Inventors: Hao Zhang, Shanghai (CN); Haibin Yu, Shanghai (CN); Liangyong Duan, Shanghai (CN); Lei Xu, Shanghai (CN)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 16/465,761

(22) PCT Filed: Oct. 26, 2017

(86) PCT No.: PCT/JP2017/038753
§ 371 (c)(1),
(2) Date: May 31, 2019

(87) PCT Pub. No.: WO2018/110115
PCT Pub. Date: Jun. 21, 2018

(65) Prior Publication Data
US 2019/0319608 A1 Oct. 17, 2019

(30) Foreign Application Priority Data
Dec. 15, 2016 (CN) .......................... 2016 1 1158586

(51) Int. Cl.
*H03H 17/02* (2006.01)
*G01G 3/147* (2006.01)

(52) U.S. Cl.
CPC ........... *H03H 17/025* (2013.01); *G01G 3/147* (2013.01); *H03H 17/0255* (2013.01)

(58) Field of Classification Search
None
See application file for complete search history.

(56) References Cited

U.S. PATENT DOCUMENTS 3,629,800 A * 12/1971 Schneider .............. G01V 1/366
367/24
3,691,486 A *  9/1972 Borsuk .................. H03H 15/00
333/166
(Continued)

FOREIGN PATENT DOCUMENTS

CN      104365076 A      2/2015
CN      105185000 A     12/2015
(Continued)

OTHER PUBLICATIONS

English translation of the International Search Report("ISR") of PCT/JP2017/038753 dated Jan. 23, 2018.
(Continued)

*Primary Examiner* — Berhanu Tadese
(74) *Attorney, Agent, or Firm* — Metrolex IP Law Group, PLLC (57) ABSTRACT

An automatic filtering method includes: a step of analyzing an input signal so as to obtain a frequency spectrum of the input signal; and a step of selecting, on the basis of the frequency spectrum, at least one filter from among a plurality of preset filters and filtering the input signal. The step of selecting includes determining, on the basis of the frequency spectrum of, a signal type in the input signal; selecting, on a basis of the signal type, a corresponding filter corresponding to the signal type; filtering the input signal with use of a first parameter of the corresponding filter and setting a second parameter for the corresponding filter on a basis of a result of the filtering; and filtering the input signal with use of the second parameter set for the corresponding filter. The method may ensure a filtering effect against noise.

7 Claims, 5 Drawing Sheets

(56) References Cited

U.S. PATENT DOCUMENTS

| | | | | |
|---|---|---|---|---|
| 4,062,060 A * | 12/1977 | Nussbaumer | ......... | G06F 17/156 708/315 |
| 4,149,259 A * | 4/1979 | Kowalski | ................. | G01J 1/00 708/315 |
| 4,578,790 A * | 3/1986 | Molo | ................. | H03H 17/0292 370/307 |
| 4,751,655 A * | 6/1988 | Peacock | ................. | G01V 1/32 367/21 |
| 5,001,445 A * | 3/1991 | Horvath | ............... | G02B 6/2861 333/165 |
| 5,225,787 A * | 7/1993 | Therssen | ............ | H03H 17/0628 327/113 |
| 5,235,534 A * | 8/1993 | Potter | ................ | H03H 17/0657 702/190 |
| 5,583,887 A * | 12/1996 | Murata | ............... | H03H 17/0657 375/229 |
| 5,661,487 A * | 8/1997 | Targoff | ............. | H03H 17/0286 342/101 |
| 5,717,618 A * | 2/1998 | Menkhoff | ......... | H03H 17/0642 708/313 |
| 5,737,254 A * | 4/1998 | Lane | ................. | H03H 17/0294 708/320 |
| 6,265,998 B1 * | 7/2001 | Banu | ................. | H03H 17/0219 341/111 |
| 6,271,778 B1 * | 8/2001 | King | ..................... | H03H 17/02 327/555 |
| 6,424,687 B1 * | 7/2002 | Tian | ..................... | H03H 17/02 327/151 |
| 6,473,014 B2 * | 10/2002 | Banu | ................. | H03H 17/0219 341/111 |
| 6,772,182 B1 * | 8/2004 | McDonald | ............ | H03H 17/02 708/314 |
| 7,107,188 B2 * | 9/2006 | Veneruso | ................. | G01V 1/36 702/187 |
| 7,283,076 B1 * | 10/2007 | Ding | ................. | H03H 17/0614 341/143 |
| 7,324,025 B1 * | 1/2008 | Ding | ................. | H03H 17/0671 341/118 |
| 8,234,324 B2 * | 7/2012 | Tietjen | ............... | H03H 17/0621 708/300 |
| 8,484,270 B2 * | 7/2013 | Kurtz | ................. | G06K 9/00536 708/300 |
| 8,526,675 B2 * | 9/2013 | Ruan | ................. | G06K 9/00355 382/103 |
| 9,077,315 B2 * | 7/2015 | Bogdan | ............. | H03H 17/0251 |
| 9,100,165 B2 * | 8/2015 | Bogdan | ............. | H03H 17/0251 |
| 9,136,891 B2 * | 9/2015 | Bogdan | ................. | H04B 1/1027 |
| 9,584,171 B2 * | 2/2017 | Bogdan | ................. | H04B 1/1027 |
| 9,769,003 B2 * | 9/2017 | Bogdan | ................. | H04L 27/266 |
| 2001/0002123 A1 * | 5/2001 | Banu | ................. | H03H 17/0219 341/122 |
| 2002/0184278 A1 * | 12/2002 | Menkhoff | ......... | H03H 17/0294 708/313 |
| 2003/0215100 A1 * | 11/2003 | Kimura | ................. | G01G 3/147 381/71.1 |
| 2004/0120598 A1 | 6/2004 | Feng | | |
| 2004/0133350 A1 * | 7/2004 | Veneruso | ................. | G01V 1/36 702/6 |
| 2005/0273482 A1 * | 12/2005 | Moore | ................. | H03H 17/025 708/300 |
| 2005/0276350 A1 * | 12/2005 | Li | ...................... | H03H 17/0294 375/302 |
| 2006/0129389 A1 * | 6/2006 | Den Brinker | ........... | G10L 19/06 704/219 |
| 2009/0149148 A1 * | 6/2009 | Kurtz | ................. | G06K 9/00536 455/307 |
| 2009/0302899 A1 * | 12/2009 | Tietjen | ............... | H03H 17/0621 327/113 |
| 2010/0232192 A1 * | 9/2010 | Mabuchi | ................. | H02J 3/383 363/124 |
| 2011/0222726 A1 * | 9/2011 | Ruan | ................. | G06K 9/00355 382/103 |
| 2012/0307923 A1 * | 12/2012 | Bogdan | ............. | H03H 17/0251 375/260 |
| 2013/0241633 A1 | 9/2013 | Honda | | |
| 2013/0287226 A1 * | 10/2013 | Kerner | ..................... | H04R 3/04 381/98 |
| 2014/0192913 A1 * | 7/2014 | Bogdan | ............. | H03H 17/0251 375/260 |
| 2014/0270020 A1 * | 9/2014 | Bogdan | ................. | H04B 1/1027 375/346 |
| 2015/0098522 A1 | 4/2015 | Shimizu | | |
| 2015/0312078 A1 * | 10/2015 | Bogdan | ................. | H04L 7/0087 375/226 |
| 2015/0319024 A1 * | 11/2015 | Bogdan | ................. | H04L 27/266 375/340 |
| 2015/0330829 A1 | 11/2015 | Heske, III | | |
| 2016/0006467 A1 * | 1/2016 | Bogdan | ................. | H04B 1/1027 375/346 |
| 2018/0019720 A1 * | 1/2018 | Hashimoto | ........... | G06F 17/156 |
| 2019/0094064 A1 | 3/2019 | Heske, III | | |
| 2019/0094065 A1 | 3/2019 | Heske, III | | |
| 2019/0319608 A1 * | 10/2019 | Zhang | ................. | G01R 23/165 |

FOREIGN PATENT DOCUMENTS

| | | | | |
|---|---|---|---|---|
| CN | 108226636 A | * | 6/2018 | .......... H03H 17/025 |
| JP | H11-316153 A | | 11/1999 | |
| JP | 2003-004517 A | | 1/2003 | |
| JP | 2003-337062 A | | 11/2003 | |
| JP | 2003337062 A | * | 11/2003 | .......... H03H 17/025 |
| WO | WO-02067422 A2 | * | 8/2002 | .......... G06F 17/153 |
| WO | WO-2018110115 A1 | * | 6/2018 | ............ G01G 3/147 |

OTHER PUBLICATIONS

Written Opinion("WO") of PCT/JP2017/038753 dated Jan. 23, 2018.
Chinese Office Action (CNOA) dated Dec. 4, 2019 in a counterpart Chinese patent application.
Extended European search report dated Jan. 28, 2020 in a related European patent application.

* cited by examiner

AUTOMATIC FILTERING METHOD AND DEVICE

TECHNICAL FIELD

The present invention relates to the field of signal processing, and in particular, to an automatic filtering method and device.

BACKGROUND ART

An analog measurement unit, for example, a weight measuring unit, receives a weak input signal that is susceptible to interference by external noise. Thus, a typical weight measuring unit includes filters for filtering an input signal to obtain an intended weight measuring signal.

Selection of a filter has in many cases depended on, for example, the user's experiences and/or experiments. The type of weight measuring unit having a smart mode selects a filter merely on the basis of, for example, how rapidly or slowly the current signal changes, and thus has a narrow application range and a limited effect. This issue may be solved by selecting a filter with use of, for example, computer software.

The above discussion of related art serves to solely provide a clear and sufficient description of the technical features of the present invention and allow a person skilled in the art to easily understand the present invention. Thus, the technical features should not be construed as being known to a person skilled in the art for the mere reason that the above discussion is provided under "Background Art" for the present invention.

SUMMARY OF INVENTION

Technical Problem

Using computer software will allow a signal to be analyzed. However, there is a technical problem of how to introduce a site signal into a computer, and another problem of the computer being incapable of obtaining information on the filtering performance of the weight measuring unit. Using computer software has thus been quite inconvenient.

Solution to Problem

In order to attain the above object, embodiments of the present invention provide an automatic filtering method and device capable of ensuring a filtering effect against various noises.

A first aspect of an embodiment of the present invention is an automatic filtering method including the steps of: (i) analyzing an input signal so as to obtain a frequency spectrum of the input signal; and (ii) selecting, on a basis of the frequency spectrum of the input signal, at least one filter from among a plurality of preset filters and filtering the input signal.

A second aspect of an embodiment of the present invention is an automatic filtering device including: a signal processing unit configured to analyze an input signal so as to obtain a frequency spectrum of the input signal; and a first filtering unit configured to select, on a basis of the frequency spectrum of the input signal, at least one filter from among a plurality of preset filters and filter the input signal.

A third aspect of an embodiment of the present invention is a weight measuring unit including: an automatic filtering device according to the second aspect, the automatic filtering device being configured to filter an input signal so as to obtain a weight measuring signal; and a calculation module configured to calculate a weight on a basis of the weight measuring signal.

Advantageous Effects of Invention

An automatic filtering method and device of the present invention automatically use a suitable filter on the basis of the result of analyzing the frequency spectrum and repeat simulation of automatic fine adjustment. This ensures a filtering effect against any of various noises.

DESCRIPTION OF EMBODIMENTS

The above and other features of the present invention will be clear from the descriptions below that refer to the drawings. The particular embodiments of the present invention that are disclosed in detail in this specification and the drawings illustrate some embodiments based on the principle of the present invention, and do not serve to limit the present invention. The present invention should rather be construed as including all alterations, modifications, and equivalents thereof within the scope of the attached claims.

The attached drawings contribute to further understanding of embodiments of the present invention, and are part of the specification. The drawings illustrate example embodiments of the present invention, and show the principle of the present invention together with the literal expressions. The drawings are, needless to say, merely representatives of some embodiments of the present invention. A person skilled in the art will be able to arrive at another drawing on the basis of the drawings on the assumption that no creative efforts are needed.

Embodiment 1

Figure 1:
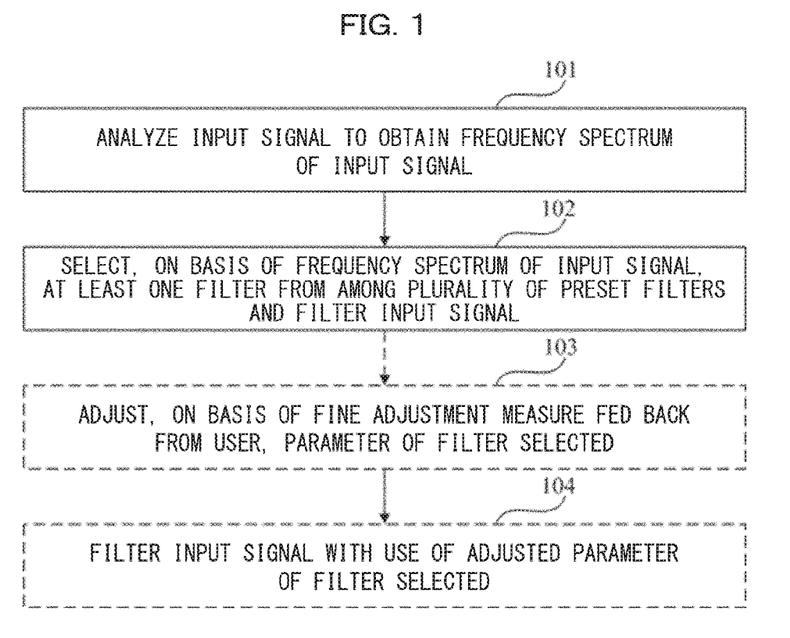
FIG. 1 is a flowchart illustrating an automatic filtering method of Embodiment 1.

The present embodiment provides an automatic filtering method. FIG. 1 is a flowchart illustrating the method. As illustrated in FIG. 1, the method includes a step 101 of analyzing an input signal and obtaining the frequency spectrum of the input signal and a step 102 of selecting, on the basis of the frequency spectrum of the input signal, at least one filter from among a plurality of preset filters and filtering the input signal.

The present embodiment, which analyzes an input signal, makes it possible to (i) fully analyze a noise environment at a use site in terms of, for example, the time domain and/or the frequency domain and (ii) obtain an analysis graph related to the frequency domain characteristics, the time domain characteristics, and the site signal component. This in turn makes it possible to (i) simulate a filtering effect of each of various filters and combinations thereof with use of a site signal and (ii) intuitively display the simulation result for the user. The result allows the user to reliably recognize the noise environment covering the user and easily understand the effect of simulation of combinations of various filters.

Step 101 is not particularly limited in terms of how a signal is analyzed. The present embodiment may use any conventional signal analysis method for analyzing an input signal to obtain the frequency spectrum of the input signal.

Step 102 may involve selecting, on the basis of the frequency spectrum of the input signal, an appropriate filter or combination of filters for filtering out an unnecessary signal (noise signal). The description below of the present embodiment assumes an example in which the automatic filtering method is used for a weight measuring unit. A typical operation signal for a weight measuring unit should, in most cases, be a low-frequency signal. Thus, a filtering measure taken after completion of signal analysis is a measure of keeping a signal having the lowest frequency (that is, a weight measuring signal) and filtering out a high-frequency signal.

Figure 2:
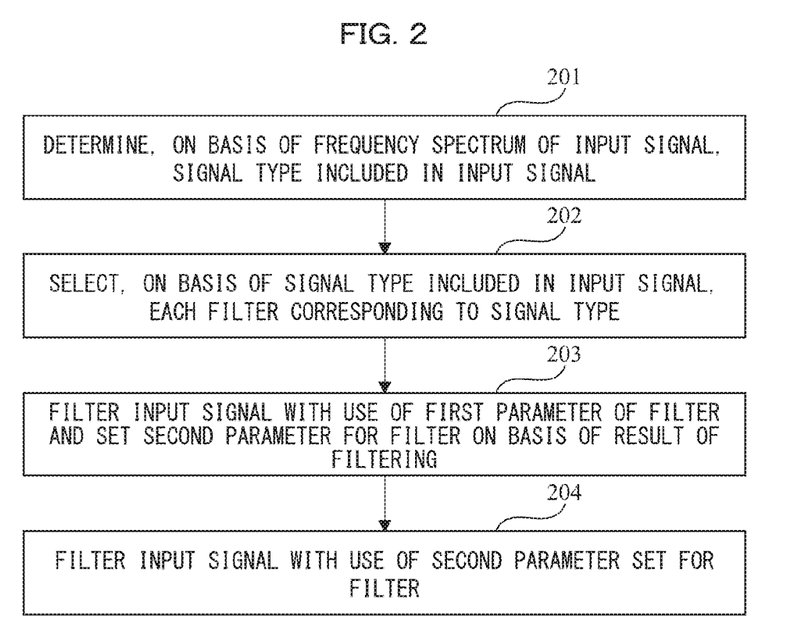
FIG. 2 is a flowchart illustrating how a filtering parameter is set for an automatic filtering method of Embodiment 1.

FIG. 2 is a flowchart illustrating an aspect of step 102. As illustrated in FIG. 2, the method includes a step 201 of, on the basis of the frequency spectrum of the input signal, determining a signal type included in the input signal, a step 202 of, on the basis of the signal type included in the input signal, selecting all filters corresponding to the signal type, a step 203 of filtering the input signal with use of a first parameter of each of the filters selected and setting a second parameter for each filter on the basis of the filtering result, and a step 204 of filtering the input signal with use of the second parameter set for each filter.

The present embodiment, as described above, analyzes an input signal to obtain the frequency spectrum of the input signal. Carrying out step 201 makes it possible to, on the basis of the frequency spectrum of the input signal, determine what type of signal is included in the input signal. The description below similarly deals with a weight measuring unit as an example. In this case, a noise signal is typically classified into three types: a signal having an electric power source frequency, a high-frequency signal having a constant cycle and frequency, and a high-frequency signal having a non-constant cycle and frequency. The signal having an electric power source frequency is a signal having a frequency of, for example, 50 Hz or 60 Hz. The high-frequency signal having a constant cycle and frequency is, for example, an oscillation due to the rotation of an electric motor in the vicinity of the weight measuring unit. The high-frequency signal having a non-constant cycle and frequency is, for example, noise caused by another electric device or machine having a non-constant frequency. Analyzing an input signal for its frequency domain makes it possible to first determine whether the input signal includes a signal having an electric power source frequency and/or a high-frequency signal having a constant cycle and frequency and then obtain the width of the frequency range in which noise having other frequencies (that is, a high-frequency signal having a non-constant cycle and frequency) belongs. This makes it possible to, on the basis of the above pieces of information, select three filters corresponding respectively to the three types in step 202.

Step 203 is a step of simply filtering the input signal with use of each of the corresponding filters selected. The description below uses the term "first parameter" to refer to a parameter of each filter selected. Step 203 also involves simply setting, on the basis of the result (first filtering result) of the filtering through each filter, a parameter (second parameter) for each filter which parameter is necessary for filtering the input signal.

The present embodiment may set a second parameter for each filter, for example, as follows: The method includes determining, on the basis of the result (first filtering result) of the filtering through each filter, whether the type of signal corresponding to the filter has been filtered out. In a case where the determination shows that the type of signal has been filtered out, the first parameter of the filter is set as a second parameter of the filter. In a case where the determination shows that the type of signal has not been filtered out, the first parameter of the filter is adjusted, and the filtering effect is simulated with use of the adjusted first parameter of the filter. The simulation involves, for example, (i) filtering an initial input signal through a filter having that parameter until the type of signal corresponding to the filter is filtered out, and (ii) determining, on the basis of the result of automatically re-analyzing the frequency spectrum of a signal having been filtered, whether the noise has been filtered out or the parameter needs readjusting. The adjusted first parameter of the filter is used as a second parameter for the filter.

Step 204 is a step of filtering the input signal with use of the second parameter obtained of each of the filters and obtain a result (second filtering result) of the filtering.

Filtering an input signal through different filters as described above allows respective filtering parameters of those filters to be obtained. Further, filtering an input signal with use of a filtering parameter of each filter makes it possible to filter out a noise signal of each type and thus obtain a necessary weight measuring signal.

The automatic filtering method of the present embodiment, as illustrated in FIG. 1, further includes a step 103 of, on the basis of a fine adjustment measure fed back from the user, adjusting a parameter of each filter selected, and a step 104 of filtering the input signal again with use of the adjusted parameter of the filter.

The present embodiment is arranged such that after a graph before filtering and a graph after filtering are fed back to the user, the user may enter a filtering request according to need. In this case, the user may, for instance, (i) select a measure of fine adjustment of a filtering parameter such as a filtering limitation condition and a filtering priority condition and (ii) provide the selected fine adjustment measure for an entity that uses the automatic filtering method of the present embodiment. In view of that, the method of the present embodiment may be arranged to include (i) adjusting, on the basis of a fine adjustment measure fed back from the user, a parameter of each filter selected and (ii) filtering the input signal again with use of the adjusted parameter of the filter to satisfy a need of the user's.

Figure 3:
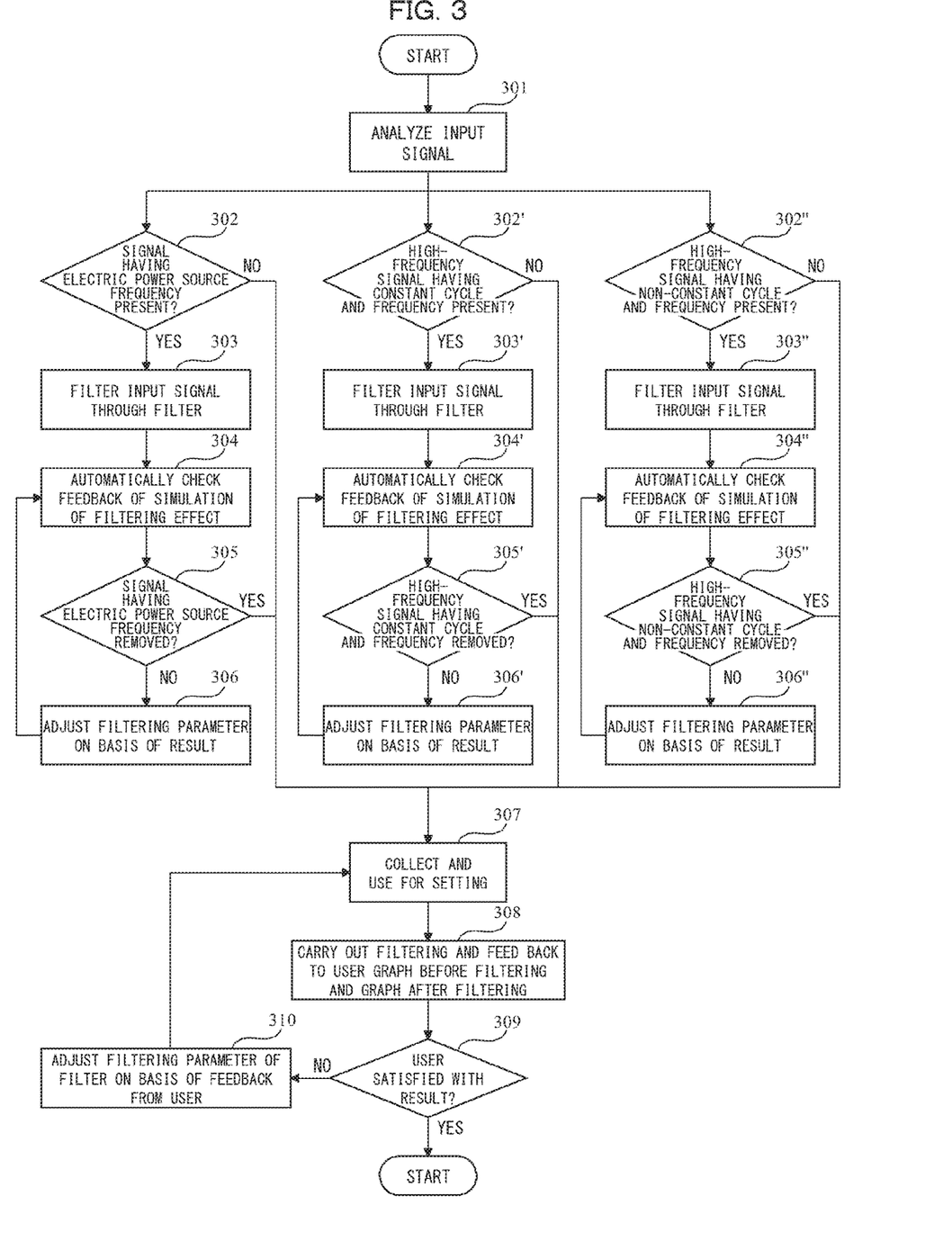
FIG. 3 is a flowchart illustrating an aspect of an automatic filtering method of Embodiment 1.

FIG. 3 is a flowchart illustrating an aspect the automatic filtering method of the present embodiment. As illustrated in FIG. 3, the method includes:

a step 301 of analyzing an input signal and obtaining the frequency spectrum of the input signal, a step 302 of (i) determining whether the input signal includes a signal having an electric power source frequency, and (ii) in a case where the determination shows that the input signal does include a signal having an electric power source frequency, proceeding to step 303 and otherwise proceeding to step 307, a step 303 of (i) selecting a filter(s) (as a notch filter) corresponding to the signal having an electric power source frequency and (ii) filtering the input signal with use of a parameter (first parameter) of the selected filter to filter out the signal having an electric power source frequency, a step 304 of automatically checking feedback related to a simulation of a filtering effect (for instance, (i) filtering a first sampled initial signal with use of a filter selected after the first parameter, then (ii) automatically analyzing the frequency spectrum of the filtering result, and (iii) on the basis of the analysis result, determining whether the intensity of the signal to be filtered out has been reduced to a level smaller than a predetermined threshold), a step 305 of (i) determining whether the signal having an electric power source frequency has been filtered out, and (ii) in a case where the determination shows that the signal having an electric power source frequency has been filtered out, proceeding to step 307 and otherwise proceeding to step 306, a step 306 of adjusting the filtering parameter (first parameter) on the basis of the filtering result, a step 307 of collecting filtering parameters (second parameters) of the individual filters and using the filtering parameters for settings, a step 308 of carrying out filtering and feeding back to the user a graph before the filtering and a graph after the filtering, a step 309 of determining whether the user has been satisfied with the result, and in a case where the determination shows that the user has been satisfied, ending the process and otherwise proceeding to step 310, and a step 310 of (i) adjusting the filtering parameters of the filters on the basis of feedback from the user and (ii) returning to step 307.

The present embodiment also includes steps 302' to 306', which are parallel with steps 302 to 306.

Step 302' is a step of (i) determining whether the input signal includes a high-frequency signal having a constant cycle and frequency, and (ii) in a case where the determination shows that the input signal does include a high-frequency signal having a constant cycle and frequency, proceeding to step 303' and otherwise proceeding to step 307.

Step 303' is a step of (i) selecting a filter (as a notch filter) corresponding to the high-frequency signal having a constant cycle and frequency and (ii) filtering the input signal with use of a parameter (first parameter) of the selected filter to filter out the high-frequency signal having a constant cycle and frequency.

Step 304' is a step of automatically checking feedback related to a simulation of a filtering effect (the measure is similar to that of step 304, and is not described here).

Step 305' is a step of (i) determining whether the high-frequency signal having a constant cycle and frequency has been filtered out, and (ii) in a case where the determination shows that the high-frequency signal having a constant cycle and frequency has been filtered out, proceeding to step 307 and otherwise proceeding to step 306'.

Step 306' is a step of adjusting the filtering parameter (first parameter) on the basis of the filtering result.

The present embodiment also includes steps 302" to 306", which are parallel with steps 302 to 306 and steps 302' to 306'.

Step 302" is a step of (i) determining whether the input signal includes a high-frequency signal having a non-constant cycle and frequency, and (ii) in a case where the determination shows that the input signal does include a high-frequency signal having a non-constant cycle and frequency, proceeding to step 303" and otherwise proceeding to step 307.

Step 303" is a step of (i) selecting a cut-off frequency on the basis of the frequency distribution range of the high-frequency signal having a non-constant cycle and frequency, (ii) selecting a filter (as a low pass filter) corresponding to the high-frequency signal having a non-constant cycle and frequency, and (ii) filtering the input signal with use of a parameter (first parameter; including the cut-off frequency) of the selected filter to filter out the high-frequency signal having a non-constant cycle and frequency.

Step 304" is a step of automatically checking feedback related to a simulation of a filtering effect (the measure is similar to that of step 304, and is not described here).

Step 305" is a step of (i) determining whether the high-frequency signal having a non-constant cycle and frequency has been filtered out, and (ii) in a case where the determination shows that the high-frequency signal having a non-constant cycle and frequency has been filtered out, proceeding to step 307 and otherwise proceeding to step 306".

Step 306" is a step of adjusting the filtering parameter (first parameter) on the basis of the filtering result.

The method of the present embodiment includes (i) automatically setting a filter on the basis of the result of analyzing a frequency spectrum and (ii) repeating simulation and automatic adjustment. This ensures a filtering effect for any of various noises.

Figure 4:
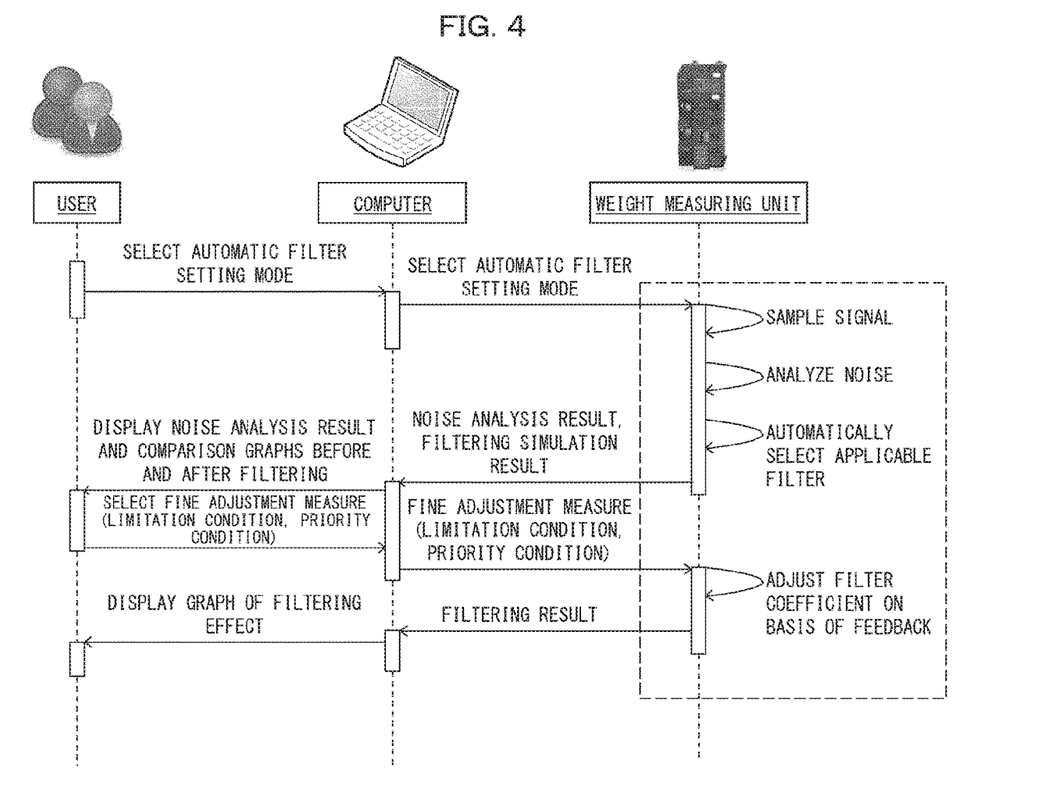
FIG. 4 is a diagram schematically illustrating how an automatic filtering method of Embodiment 1 can be applied.

FIG. 4 is a diagram schematically illustrating how the automatic filtering method of the present embodiment can be applied. The description below of this applied case similarly deals with a weight measuring unit as an example. As illustrated in FIG. 4, the user first selects an automatic filter setting mode and enters an instruction to that effect into a weight measuring unit via a computer. The weight measuring unit uses the method of the present embodiment to first sample a signal and then analyze the noise (step 101), automatically select an applicable filter(s) (step 102), and obtain the filtering result (namely, the result of analyzing the noise and the result of filtering simulation (for example, a curve indicative of a change of the result through the filtering and/or a comparison graph as a result of analyzing the frequency spectrum before and after the filtering)). Then, the filtering result is fed back to the user via the computer. In a case where the user has been satisfied with the filtering result, the user ends the process. Otherwise, the user selects a fine adjustment measure (such as a limitation condition and a priority condition) and enters an instruction (feedback) to that effect into the weight measuring unit via the computer. The weight measuring unit uses the method of the present embodiment to (i) adjust the coefficient (filtering parameter) of the filter on the basis of the feedback (step 103) and (ii) carry out filtering again (step 104). Then, the weight measuring unit feeds back the result of carrying out filtering again to the user via the computer.

Analyzing the frequency spectrum of an input signal as described above makes it possible to (i) combine suitable filters in accordance with the actual environment and thereby (ii) produce a weight measuring effect that matches a demand of the user's.

The method of the present embodiment makes it possible to (i) obtain a final product directly from a site signal and (ii) achieve high consistency and cooperation in analysis, good flexibility, and a high level of automation. This allows potential properties and effects of filters in the weight measuring unit to be fully produced.

Embodiment 2

The present embodiment provides an automatic filtering device. The device is intended to attain an object of which the principle is similar to that of the object that the method of Embodiment 1 is intended to attain. For specific aspects of the device, refer to the description of Embodiment 1. The description below thus does not deal with common matters.

Figure 5:
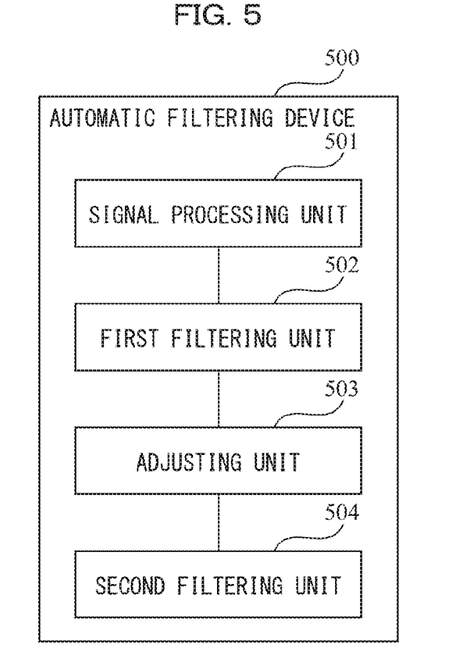
FIG. 5 is a diagram schematically illustrating an automatic filtering device of Embodiment 2.

FIG. 5 is a diagram schematically illustrating the automatic filtering device of the present embodiment. As illustrated in FIG. 5, the device 500 includes (i) a signal processing unit 501 for analyzing an input signal and obtaining the frequency spectrum of the input signal and (ii) a first filtering unit 502 for selecting, on the basis of the frequency spectrum of the input signal, at least one filter from among a plurality of preset filters and filtering the input signal.

The device 500 of the present embodiment may further include (i) an adjusting unit 503 for adjusting, on the basis of a fine adjustment measure fed back from the user, a parameter of each filter selected and (ii) a second filtering unit 504 for filtering the input signal again with use of the adjusted parameter of the filter.

Figure 6:
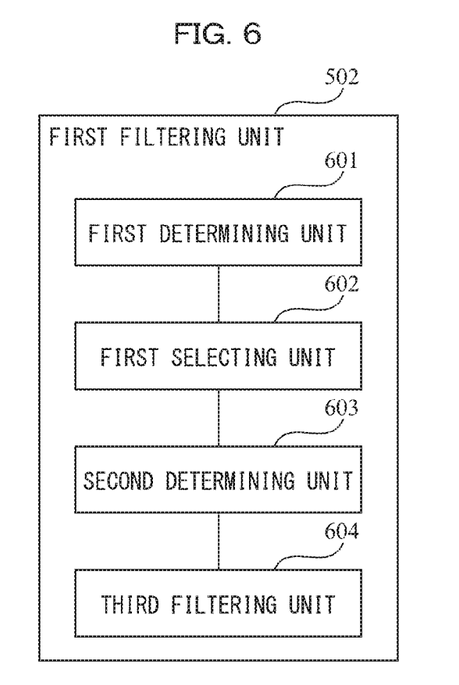
FIG. 6 is a diagram schematically illustrating an aspect of a first filtering unit in an automatic filtering device of Embodiment 2.

FIG. 6 is a diagram schematically illustrating an aspect of the first filtering unit 502 of the present embodiment. As illustrated in FIG. 6, the first filtering unit 502 includes (i) a first determining unit 601 for, on the basis of the frequency spectrum of the input signal, determining a signal type included in the input signal, (ii) a first selecting unit 602 for, on the basis of the signal type included in the input signal, selecting all filters corresponding to the signal type, (iii) a second determining unit 603 for filtering the input signal with use of a first parameter of each of the filters selected and setting a second parameter for each filter on the basis of the filtering result, and (iv) a third filtering unit 604 for filtering the input signal with use of the second parameter set for each filter.

The present embodiment may be arranged as follows: The second determining unit 603 determines, on the basis of the filtering result, whether the type of signal corresponding to the filter has been filtered out. In a case where the determination shows that the type of signal has been filtered out, the second specifying unit 603 sets the first parameter of the filter as a second parameter of the filter. In a case where the determination shows that the type of signal has not been filtered out, the second specifying unit 603 (i) repeats a process of adjusting the first parameter of the filter and simulating the filtering result with use of the adjusted first parameter until the type of signal corresponding to the filter is filtered out and (ii) sets the adjusted first parameter as a second parameter of the filter.

For the present embodiment, signal types that can be included in an input signal include a signal having an electric power source frequency, a high-frequency signal having a constant cycle and frequency, and a high-frequency signal having a non-constant cycle and frequency.

The automatic filtering device 500 of the present embodiment may be contained in a weight measuring unit. The arrangement is, however, not limited to that as described above. The automatic filtering device 500 may be mounted in any device, unit, or module that requires analog measurement. Specific embodiments vary slightly from case to case, but are all within the scope of the claims of the present application.

The device of the present embodiment makes it possible to (i) obtain a final product directly from a site signal and (ii) achieve high consistency and cooperation in analysis, good flexibility, and a high level of automation. This allows potential properties and effects of filters in the weight measuring unit to be fully produced.

Embodiment 3

The present embodiment provides a weight measuring unit including the automatic filtering device according to Embodiment 2 which automatic filtering device uses the automatic filtering method according to Embodiment 1. The automatic filtering device, for instance, filters an input signal to obtain a weight measuring signal. The respective descriptions of Embodiments 1 and 2 have already dealt with the details of the automatic filtering method and the automatic filtering device. The descriptions are incorporated by reference for the present embodiment, and are not repeated here.

The weight measuring unit of the present embodiment may include, in addition to the automatic filtering device, a calculation module for calculating the weight on the basis of a weight measuring signal obtained from the automatic filtering device. For specific aspects of the calculation module, refer to conventional art. A description of the specific aspects is omitted here.

Figure 7:
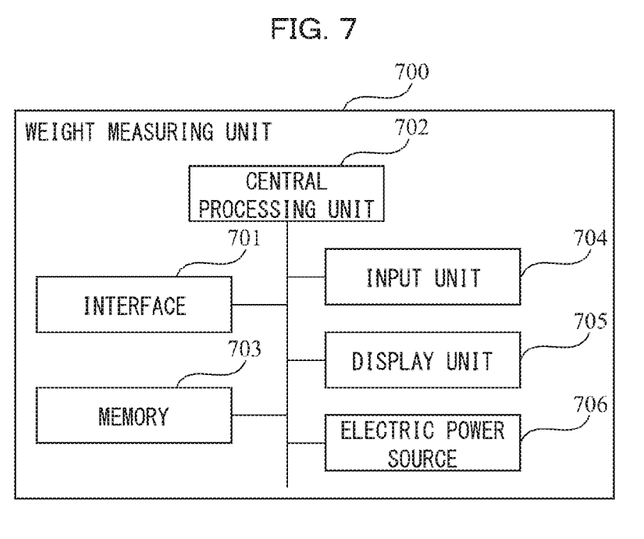
FIG. 7 is a diagram schematically illustrating a weight measuring unit of Embodiment 3.

FIG. 7 is a diagram schematically illustrating a hardware configuration as an aspect of the weight measuring unit of the present embodiment. As illustrated in FIG. 7, the weight measuring unit 700 includes an interface 701, a central processing unit 702, and a memory 703. The interface 701 serves to, for example, receive an input signal, feed back a filtering result (namely, a graph before the filtering and a graph after the filtering), and obtain a fine adjustment measure fed back from the user. The memory 703 stores, for example, various pieces of data, programs for the automatic filtering method, and various preset values and conditions. The memory 703 also allows the programs to be executed under control of the central processing unit 702.

As an aspect, the functions of the automatic filtering device 500 may be implemented by the central processing unit 702. The central processing unit 702 may be configured to carry out (i) a step of analyzing an input signal and obtaining the frequency spectrum of the input signal and (ii) a step of selecting, on the basis of the frequency spectrum of the input signal, at least one filter from among a plurality of preset filters and filtering the input signal. The central processing unit 702 may be further configured to carry out the functions of the calculation module. A description thereof is omitted here.

A different aspect may include a chip (not shown) connected to the central processing unit 702 on which chip the automatic filtering device 500 and/or calculation module is provided and which chip carries out the functions of the automatic filtering device 500 and/or calculation module under control of the central processing unit 702.

The weight measuring unit 700 does not necessarily include all the elements illustrated in FIG. 7. Further, the weight measuring unit 700 may include an element(s) other than the above such as an input unit 704, a display unit 705, and an electric power source 706 shown in FIG. 7. For those elements, refer to conventional art.

The weight measuring unit of the present embodiment makes it possible to (i) obtain a final product directly from a site signal and (ii) achieve high consistency and cooperation in analysis, good flexibility, and a high level of automation. This allows potential properties and effects of filters in the weight measuring unit to be fully produced.

The present invention has been described above on the basis of specific embodiments. The descriptions are, however, merely of examples, and do not limit the scope of protection sought for the present invention. A person skilled in the art will be able to alter and modify the present invention variously on the basis of its spirit and principle. Such alteration and modification are also within the scope of the present invention.

It should be noted that the particular embodiments of the present invention disclosed in detail in the descriptions above with reference to the drawings serve to show aspects applicable to the principle of the present invention and that embodiments of the present invention are not limited by the descriptions above. Embodiments of the present invention include various alterations and modifications within the spirit and matters of the attached claims as well as equivalents thereof.

A feature described or mentioned for an embodiment may be applied to one or more other embodiments by a similar or analogous method to be combined with or replace a feature of such other embodiments.

The word "include" as used herein is intended to mean the presence of a feature, part, step, or component. The word is not intended to exclude the presence or addition of one or more other features, parts, steps, or components.

The invention claimed is:

1. An automatic filtering method, comprising the steps of:
   (i) analyzing an input signal so as to obtain a frequency spectrum of the input signal; and
   (ii) selecting, on a basis of the frequency spectrum of the input signal, at least one filter from among a plurality of preset filters and filtering the input signal,
   the step (ii) including:
      determining, on the basis of the frequency spectrum of the input signal, a signal type included in the input signal;
      selecting, on a basis of the signal type included in the input signal, a corresponding filter corresponding to the signal type;
      filtering the input signal with use of a first parameter of the corresponding filter and setting a second parameter for the corresponding filter on a basis of a result of the filtering; and
      filtering the input signal with use of the second parameter set for the corresponding filter,
   the setting of the second parameter for the corresponding filter on the basis of the result of the filtering including:
      determining, on the basis of the result of the filtering, whether a type of signal which type corresponds to the corresponding filter has been filtered out;
      in a case where the determining shows that the type of signal which type corresponds to the corresponding filter has been filtered out, setting the first parameter of the corresponding filter as the second parameter; and
      in a case where the determining shows that the type of signal which type corresponds to the corresponding filter has not been filtered out, repeating a process of adjusting the first parameter of the corresponding filter and simulating a filtering result with use of the adjusted first parameter until the type of signal which type corresponds to the corresponding filter is filtered out and setting the adjusted first parameter as the second parameter.

2. The automatic filtering method according to claim 1, further comprising the steps of:
   (iii) adjusting, on a basis of a fine adjustment measure fed back from a user, a parameter of the at least one filter selected; and
   (iv) filtering the input signal again with use of the adjusted parameter of the at least one filter selected.

3. The automatic filtering method according to claim 1, wherein
   the signal type included in the input signal includes a signal having an electric power source frequency, a high-frequency signal having a constant cycle and frequency, and a high-frequency signal having a non-constant cycle and frequency.

4. An automatic filtering device, comprising:
   a signal processing unit configured to analyze an input signal so as to obtain a frequency spectrum of the input signal; and
   a first filtering unit configured to select, on a basis of the frequency spectrum of the input signal, at least one filter from among a plurality of preset filters and filter the input signal,
   the first filtering unit including:
      a first determining unit configured to determine, on the basis of the frequency spectrum of the input signal, a signal type included in the input signal;
      a first selecting unit configured to select, on a basis of the signal type included in the input signal, a corresponding filter corresponding to the signal type;
      a second determining unit configured to filter the input signal with use of a first parameter of the corresponding filter and set a second parameter for the corresponding filter on a basis of a result of the filtering; and
      a third filtering unit configured to filter the input signal with use of the second parameter set for the corresponding filter,
   the second determining unit being configured to carry out
      a task of determining, on the basis of the result of the filtering, whether a type of signal which type corresponds to the corresponding filter has been filtered out;
      a task of, in a case where the determining shows that the type of signal which type corresponds to the corresponding filter has been filtered out, setting the first parameter of the corresponding filter as the second parameter; and
      a task of, in a case where the determining shows that the type of signal which type corresponds to the corresponding filter has not been filtered out, repeating a process of adjusting the first parameter of the corresponding filter and simulating a filtering result with use of the adjusted first parameter until the type of signal which type corresponds to the corresponding filter is filtered out and setting the adjusted first parameter as the second parameter.

5. The automatic filtering device according to claim 4, further comprising:
   an adjusting unit configured to adjust, on a basis of a fine adjustment measure fed back from a user, a parameter of the at least one filter selected; and
   a second filtering unit configured to filter the input signal again with use of the adjusted parameter of the at least one filter selected.

6. The automatic filtering device according to claim 4, wherein the signal type included in the input signal includes a signal having an electric power source frequency, a high-frequency signal having a constant cycle and frequency, and a high-frequency signal having a non-constant cycle and frequency.

7. A weight measuring unit, comprising:

an automatic filtering device according to claim 4, the automatic filtering device being configured to filter an input signal so as to obtain a weight measuring signal; and a calculation module configured to calculate a weight on a basis of the weight measuring signal.

\* \* \* \* \*